US006872981B1

(12) United States Patent
Horiuchi et al.

(10) Patent No.: US 6,872,981 B1
(45) Date of Patent: Mar. 29, 2005

(54) DIAMOND ULTRAVIOLET LUMINESCENT ELEMENT

(75) Inventors: Kenji Horiuchi, Tokyo (JP); Takefumi Ishikura, Tokyo (JP); Satoshi Yamashita, Tokyo (JP); Aki Kawamura, Tokyo (JP); Kazuo Nakamura, Tokyo (JP); Kenichi Nakamura, Tokyo (JP); Takahiro Ide, Tokyo (JP)

(73) Assignee: Tokyo Gas Co., Ltd., Tokyo (JP)

( * ) Notice: Subject to any disclaimer, the term of this patent is extended or adjusted under 35 U.S.C. 154(b) by 59 days.

(21) Appl. No.: 10/019,275

(22) PCT Filed: Jun. 29, 2000

(86) PCT No.: PCT/JP00/04301

§ 371 (c)(1),
(2), (4) Date: Jan. 3, 2002

(87) PCT Pub. No.: WO01/04966

PCT Pub. Date: Jan. 18, 2001

(30) Foreign Application Priority Data

Jul. 7, 1999 (JP) ............................................. 11-192554
Feb. 9, 2000 (JP) ....................................... 2000-032096

(51) Int. Cl.[7] ............................................. H01L 29/16
(52) U.S. Cl. ........................................ 257/77; 257/103
(58) Field of Search .................................. 257/77, 103

(56) References Cited

U.S. PATENT DOCUMENTS 5,223,721 A * 6/1993 Iida et al. ...................... 257/77

| 5,389,799 A | | 2/1995 | Uemoto .......................... 257/77 |
|---|---|---|---|
| 5,500,539 A | * | 3/1996 | Kadono et al. ................ 257/77 |
| 6,433,474 B1 | | 8/2002 | Horiuchi ....................... 313/499 |

FOREIGN PATENT DOCUMENTS

| EP | 0377320 | 7/1990 |
|---|---|---|
| EP | 0390209 A2 | 10/1990 |
| EP | 0918100 A1 | 5/1999 |
| JP | 02-017631 | 1/1990 |
| JP | 03-165074 | 7/1991 |
| JP | 04-240784 | 8/1992 |
| JP | 05-140550 | 6/1993 |
| JP | 05-152604 | 6/1993 |
| JP | 07-307487 | 11/1995 |

OTHER PUBLICATIONS

International Search Report dated Oct. 3, 2000.

* cited by examiner

*Primary Examiner*—Gene M. Munson
(74) *Attorney, Agent, or Firm*—Westerman, Hattori, Daniels & Adrian, LLP

(57) ABSTRACT

A diamond ultraviolet luminescent element (10) having a current-injection light-emitting diode structure includes a high-quality boron-doped p-type diamond crystal (semiconductor layer) (1) synthesized by the high pressure and high temperature method; a phosphorous-doped n-type diamond crystal (n-type semiconductor layer) (3) formed on the first diamond surface by the chemical vapor deposition; an electrode (5) formed on the surface of the n-type semiconductor layer (3); and an electrode (7) formed on the surface of the p-type semiconductor layer (1). The luminescence (235 nm) attributed to the recombination of free excitons resulting from current injection dominates in ultraviolet wavelength region (10).

17 Claims, 9 Drawing Sheets

DIAMOND ULTRAVIOLET LUMINESCENT ELEMENT

FIELD OF THE INVENTION

The present invention relates to a diamond ultraviolet light-emitting device having a diode structure for realizing the free exciton recombination radiation utilizing a diamond grown by the chemical vapor deposition method, capable of being applied to the field of optical information read/write processing, photolithography, optical processing, phosphor excitation light source and the like.

SUMMARY OF THE INVENTION

Owing to its short wavelength, ultraviolet light can be utilized for micro fabrication, and there are various demands for ultraviolet technology such as improving the recording density of the optical read/write processing or improving the packaging density in the semiconductor devices.

A dutrium lamp and an excimer laser are two examples of the light source in the ultraviolet wavelength region. However, according to the dutrium lamp, the ultraviolet light emission has low efficiency and low brightness. As for the excimer lasers utilizing gas, the device is dangerous and inconvenient to handle since it is large and requires cooling water and halogen. Therefore, the conventional ultraviolet light sources have various inconveniences for actual applications.

On the other hand, diamond is also known as material that emits ultraviolet light. The diamond ultraviolet light-emitting device is small in size, highly efficient, very bright, and is advantageously safe to use.

Especially in the case of a light emitting device having a diode structure such as a pn junction, the luminous efficiency is improved even further. This is because for example in a pn junction, an energy barrier exists at the interface between the p-type layer and the n-type layer that stores the carrier contributing to the light emission. The light emitting portion is approximately the border between the p-type layer and the n-type layer.

The conventional diamond light-emitting device is disclosed for example in (1) Japanese Patent Laid-Open Publication No. 4-240784(240784/92), (2),Japanese Patent Laid-Open Publication No. 7-307487 (307487/95), and (3) Japanese Patent Laid-Open Publication No. 5-152604 (152604/93).

According to these conventional diamond light-emitting devices, the diamond forming the p-type layer is doped with boron, and the diamond forming the n-type layer is doped with lithium, phosphorous and the like, and they realize a diode property. However, according to the ultraviolet radiation of the conventional diamond light-emitting device, light emission was caused mainly by impurities or lattice defects, and the free exciton recombination radiation intrinsic to diamond and having a short wavelength is not dominant.

There are explanations on the free exciton recombination radiation in the above-mentioned publications, but they are merely explanations on the result of radiating electron beams to the diamond from the exterior and measuring the light emission by the cathode luminescence (CL) method so as to confirm the properties of the diamond.

Japanese Patent Laid-Open Publication No. 4-240784 discloses an ultraviolet light-emitting device formed by providing a boron-doped p-type diamond crystal semiconductor layer on a monocrystal diamond substrate, forming on top an undoped diamond film, and further forming thereon a phosphorous-doped n-type diamond crystal semiconductor layer, and an ultraviolet light-emitting device forming on one surface of a p-type monocrystal substrate a diamond film having both boron and phosphorous doped thereto, and further forming on the diamond film a phosphorous-doped diamond film. According to the publication, the former ultraviolet light-emitting device has an ultraviolet radiation peak at 260 nm caused by boron-related band radiation, and the latter device has an ultraviolet radiation peak at around 400 nm, and the disclosure aims at providing a solid-state ultraviolet light-emitting device driven simply by current injection, but according to the above devices of the prior art, ultraviolet radiation of 235 nm caused by the free exciton recombination radiation resulting from current injection is not dominant. Further, Japanese Patent Laid-Open Publication No. 7-307487 discloses a short-wavelength light-emitting device comprising a low-resistance p-type semiconductor diamond layer doped with impurities such as boron, and a high-resistance diamond layer formed of either non-additive diamond or semiconductor diamond. These diamond layers are formed of a high-quality diamond capable of realizing the free exciton recombination radiation observed in CL spectrum at room temperature, but the emission spectrum generated when applying voltage between the electrodes has an ultraviolet radiation peak at 238 nm, which shows that the radiation peak is caused by boron bound exciton recombination radiation, and that the ultraviolet radiation of 235 nm caused by the free exciton recombination radiation having advantageous luminous efficiency is not dominant.

Japanese Patent Laid-Open Publication No. 5-152604 discloses a diamond semiconductor device formed by chemical vapor deposition method and including a pn junction, wherein in embodiment 11, a diamond semiconductor device is disclosed where the p-type semiconductor region includes boron as the impurity and the n-type semiconductor region includes lithium as the impurity. When voltage is applied thereto, the semiconductor device emits light having a peak at 440 nm. However, the publication does not refer to the ultraviolet radiation of the free exciton recombination radiation caused by current injection. Japanese Patent Laid-Open Publication No. 3-222376 discloses a diamond semiconductor light-emitting device that radiates for example a pale blue light having a short wavelength, wherein the device comprises forming on a low-resistance silicon substrate a p-type semiconductor diamond layer, and an insulating diamond layer thereabove, further forming an ohmic electrode on a portion of the surface of the p-type semiconductor diamond layer, and a surface electrode on the insulating diamond layer, wherein the formed light-emitting device emits greenish white light. The publication further discloses forming on a low-resistance silicon substrate an n-type semiconductor diamond layer, and forming an insulating diamond layer thereabove, forming a back electrode on the back surface of the n-type semiconductor diamond and a surface electrode on the insulating diamond layer, wherein the light-emitting device emits pale blue light. However, there is no description in the publication that the semiconductor light-emitting device emits ultraviolet resulting from free exciton recombination radiation.

When considering a diode-structure diamond ultraviolet light-emitting device, the light emission caused by impurities/defects has a longer wavelength compared to the intrinsic light emission as disclosed in Japanese Patent Laid-Open Publication No. 4-240784 or No. 7-307487, and therefore it is not desirable as a short-wavelength light-emitting device. Furthermore, in order to improve the emission intensity, it is necessary to introduce high density of defects or high concentration of impurity to the diamond crystal, and as a result, the quality of the crystal is deteriorated and the intensity of the ultraviolet light emission is reduced. Even further, the emission peaks at various wavelengths induced by the introduction of impurities/defects consumed a portion of the injected energy, deteriorating the efficiency of even the useful ultraviolet radiation. Due to these reasons, the light emission caused by impurities or defects is not practical for the mechanism of a current-injection light-emitting device.

On the other hand, the free exciton recombination radiation is a light emission intrinsic to each material, and generally has the shortest wavelength and a high density of states compared to the variety of other light emissions obtained from the material, so it is most preferable for realizing a practical bright light-emitting device. As for diamond, the intrinsic spectrum related to the free exciton recombination radiation is studied using analyzing methods such as the CL method. The energy of the free exciton of diamond at room temperature corresponds to a wavelength of 229 nm, but actually, light emissions called the phonon side band group that appear near 235 nm, 242 nm, 249 nm and 257 nm are mainly observed. In general, all of the above are inclusively called "free exciton recombination radiations", but the light that is most preferable in an ultraviolet light-emitting device is the light having energy around 235 nm, and in the present specification, this specific light emission is called the "free exciton recombination radiation".

DISCLOSURE OF THE INVENTION

As explained, the conventional diamond ultraviolet light-emitting device utilizes a light-emitting diamond crystal layer that is poor in quality and containing a lot of impurities or defects. Therefore,when a diamond crystal is used to realize a current-injection light-emitting device, it is impossible to obtain sufficient radiation intensity by the free exciton recombination radiation that is the most advantageous radiation in practical use.

For example, Japanese Patent Laid-Open Publication No. 4-240784 discloses a diamond light-emitting device with a p-i-n diode structure that has a peak at a wavelength of 400 nm and emits light having a wide range of wavelength from 300 nm to 500 nm. This radiation is longer in wavelength compared to the free exciton recombination radiation, and is not preferable for micro fabrication. Moreover, this radiation is clearly caused by impurities or lattice defects, so it is difficult to improve the radiation efficiency of the device and is disadvantageous when applied to practical use.

Moreover, Japanese Patent Laid-Open Publication No. 7-307487 discloses the spectrum of a light-emitting device, according to which the intensity of the free exciton recombination radiation (235 nm) being the radiation intrinsic to diamond is clearly smaller than (and less than half) the intensity of the bound exciton radiation (238 nm) being one example of radiation caused by impurities or defects.

In comparison, the diode-structure diamond light-emitting device according to the present invention provides the free exciton recombination radiation having an intensity that is greater than the intensity of the bound exciton recombination radiation being one example of radiation caused by impurities or defects, the former being more than at least twice the value of the latter in intensity ratio. In this specification, this defines the ultraviolet radiation in which the free exciton recombination radiation is dominant.

The object of the present invention is to provide using a diode structure a current-injection excitation diamond ultraviolet light-emitting device in which the free exciton recombination radiation is dominant, the light having a short wavelength that is intrinsic to diamond.

In order to achieve the above object, the present invention proposes in claim 1 a diode-structure diamond ultraviolet light-emitting device comprising a p-type semiconductor layer formed of diamond crystal, and an n-type semiconductor layer formed of diamond crystal, the device emitting light when excited by current injection, and wherein the free exciton recombination radiation is dominant.

Claim 2 of the present invention refers to a diode-structure diamond ultraviolet light-emitting device according to claim 1, wherein the free exciton recombination radiation being dominant refers to a state where the intensity of the free exciton recombination radiation is at least two times or more greater than the intensity of radiation caused by impurities or defects within the range where the wavelength of the current injection emission spectrum is 300 nm or smaller.

Claim 3 discloses a diode-structure diamond ultraviolet light-emitting device according to claim 1 or claim 2, wherein the diode-structure comprises a pn junction.

Claim 4 refers to a diode-structure diamond ultraviolet light-emitting device according to claim 1, 2 or 3, wherein both diamond crystals are high-quality crystals including only a very small amount of impurity other than the dopant.

A dopant is a substance that is added intentionally to a diamond crystal so as to control the electric conductivity and the light emission property of the crystal. However, even when a dopant is added to the diamond crystal, in the diamond light-emitting device according to the present invention, the free exciton recombination radiation resulting from current injection is dominant.

Claim 5 refers to a diode-structure diamond ultraviolet light-emitting device according to claim 1, 2, 3 or 4, wherein the n-type diamond crystal is a diamond crystal doped with phosphorous.

Claim 6 refers to a diode-structure diamond ultraviolet light-emitting device according to claim 1, 2, 3 or 4, wherein the n-type diamond crystal is a diamond crystal doped with sulfur.

Claim 7 refers to a diode-structure diamond ultraviolet light-emitting device according to any one of claims 1 through 6, wherein the n-type diamond crystal is a diamond crystal grown by the chemical vapor deposition (CVD) method.

Claim 8 refers to a diode-structure diamond ultraviolet light-emitting device according to any one of claims 1 through 7, wherein the p-type semiconductor diamond crystal is a diamond crystal doped with boron.

Claim 9 refers to a diode-structure diamond ultraviolet light-emitting device according to claim 8, wherein the boron-doped diamond crystal has a boron concentration of 100 ppm or smaller.

Claim 10 refers to a diode-structure diamond ultraviolet light-emitting device according to any one of claims 1 through 9, wherein the p-type semiconductor diamond crystal is a crystal synthesized by the high temperature and high pressure method.

Claim 11 refers to a diode-structure diamond ultraviolet light-emitting device according to claim 10, wherein the high-temperature and high-pressure synthetic diamond is synthesized by adding a nitrogen remover to the flux.

Claim 12 refers to a diode-structure diamond ultraviolet light-emitting device according to any one of claims 1 through 9, wherein the p-type semiconductor diamond crystal is a diamond grown by CVD method.

Claim 13 refers to a diode-structure diamond ultraviolet light-emitting device according to any one of claims 7 through 12, wherein the CVD diamond crystal is a homoepitaxial film grown homoepitaxially on a diamond crystal substrate.

Claim 14 refers to a diode-structure diamond ultraviolet light-emitting device according to claim 7, 12 or 13, wherein the vapor synthetic diamond crystal is a diamond crystal film grown by the microwave plasma-assisted CVD(MW-CVD) method.

Claim 15 refers to a diode-structure diamond ultraviolet light-emitting device according to any one of claims 1 through 11, the device comprising a p-type semiconductor diamond crystal synthesized by the high temperature and high pressure method, and a n-type CVD diamond crystal grown thereon.

Claim 16 refers to a diode-structure diamond ultraviolet light-emitting device according to any one of claims 1 through 9 or claims 12 through 15, wherein a first CVD diamond crystal is formed on a diamond substrate, and a second CVD diamond crystal is further formed thereon.

Claim 17 refers to a diode-structure diamond ultraviolet light-emitting device according to claim 16, wherein the first CVD diamond crystal is either a p-type semiconductor diamond crystal or an n-type semiconductor diamond crystal, and the second CVD diamond crystal is either an n-type semiconductor diamond crystal or a p-type semiconductor diamond crystal that differs from the first CVD diamond crystal.

Claim 18 refers to a diode-structure diamond ultraviolet light-emitting device according to claim 16 or 17, wherein the second CVD diamond layer is grown selectively on the first CVD diamond layer.

Claim 19 refers to a diode-structure diamond ultraviolet light-emitting device according to claim 16, 17 or 18, wherein an electrode is formed on the exposed surface of the first CVD diamond layer.

BRIEF DESCRIPTION OF THE DRAWINGS

In FIG. 1, reference 1 is a boron-doped high-pressure diamond p-type crystal layer (p-type semiconductor layer), 3 is a phosphorous-doped n-type CVD diamond layer/ sulfur-doped n-type CVD diamond layer (n-type semiconductor layer), 5 shows individual electrodes (first electrode (W/Ti)), 51 shows aluminum wires (lead wires), 7 designates a common electrode (second electrode (W/Ti)), 71 shows an aluminum wire (lead wire), and 10 is a pn junction-type diode structure diamond ultraviolet light-emitting device.

DETAILED DESCRIPTION OF PREFERRED EMBODIMENTS

The actual structure of a diamond ultraviolet light-emitting device having a diode structure according to the first embodiment of the present invention, in which the free exciton recombination radiation is dominant and which is operated by current injection, is explained with reference to FIG. 1 and FIG. 2.

Figure 1:
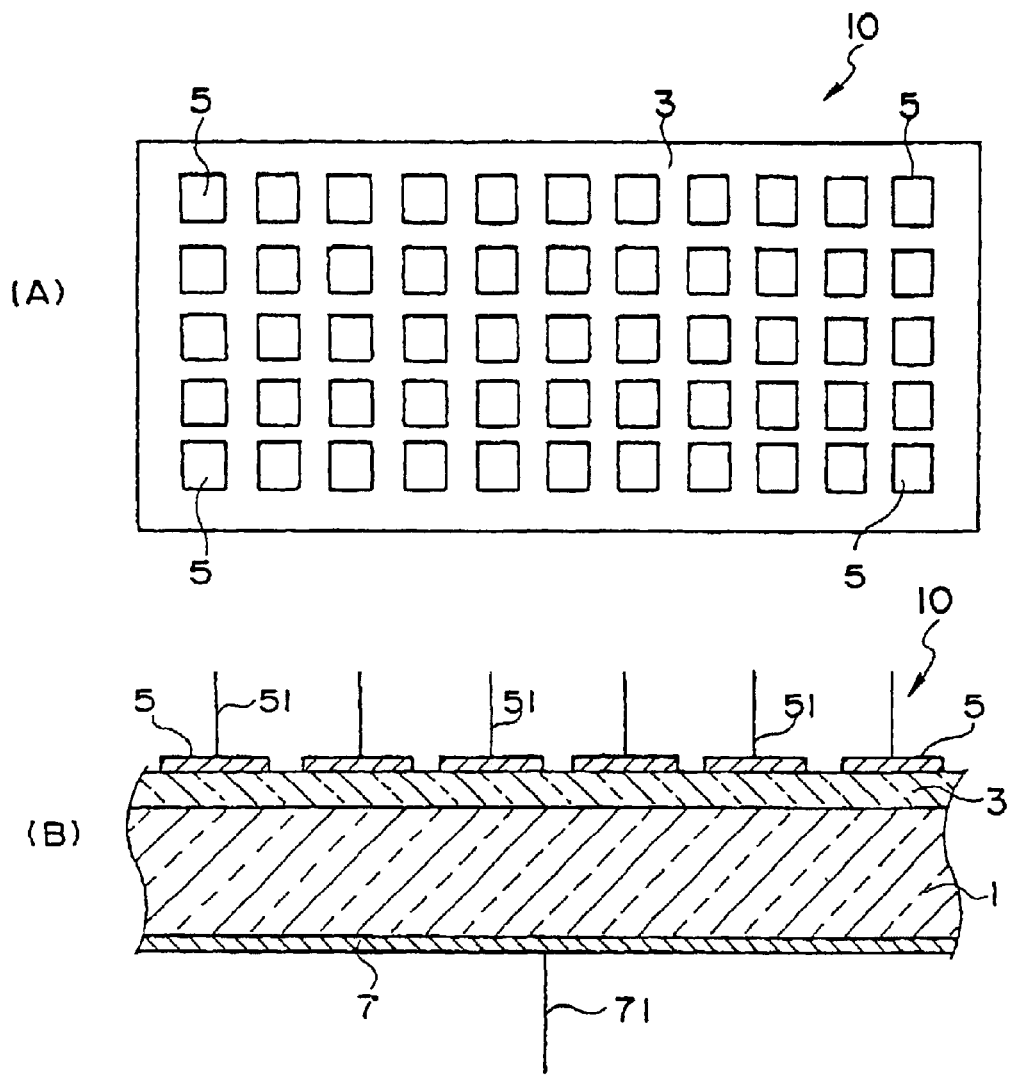
FIG. 1 is a conceptual diagram showing the diode-structure diamond ultraviolet light-emitting device according to an embodiment of the present invention.
Figure 2:
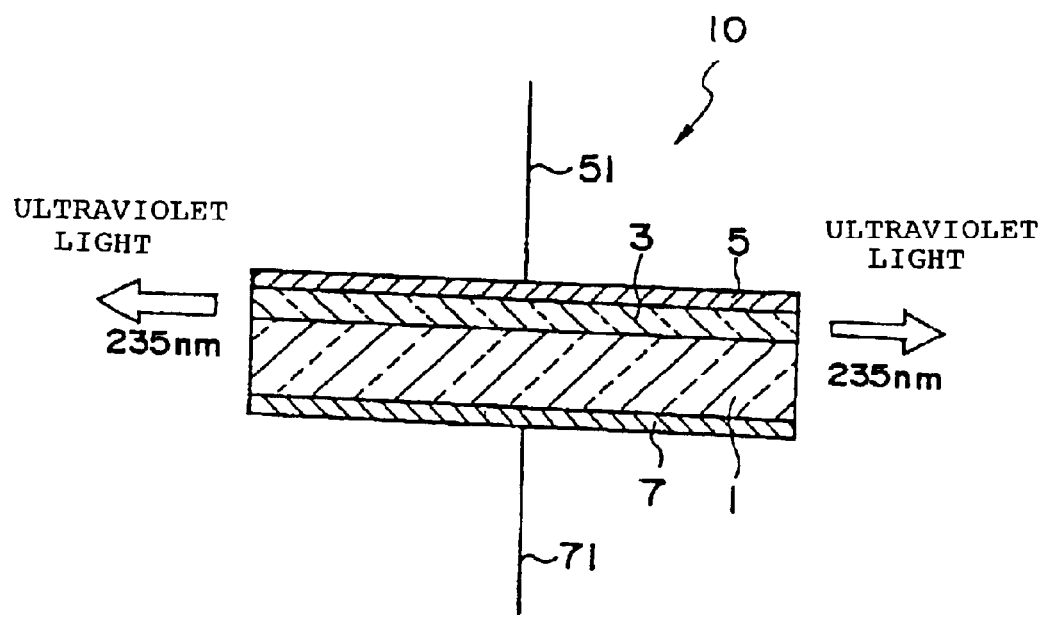
FIG. 2 is an enlarged view showing the principle of the structure of the diode-structure diamond ultraviolet light-emitting device according to the present invention.

FIG. 1(A) is a plan view showing a typical structure of a multiple light-emitting device 10, having a plurality of pn junction diode-structure diamond ultraviolet light-emitting devices on a single substrate in which the free exciton recombination radiation caused by current injection is dominant, and FIG. 1(B) is a cross-sectional view thereof. FIG. 2 is a principle diagram showing in enlarged view one of the pn junction diode-structure diamond ultraviolet light-emitting devices 10 shown in FIG. 1, wherein all the light-emitting devices of FIG. 1 have the same structure shown in FIG. 2.

The pn junction diamond ultraviolet light-emitting device 10 realizing the free exciton recombination radiation comprises a p-type semiconductor layer 1 formed of boron-doped synthetic diamond p-type crystal obtained by the high temperature and high pressure method, a phosphorous-doped CVD diamond n-type crystal layer (n-type semiconductor layer) 3 grown on the surface of the p-type semiconductor layer 1 by the CVD method, a plurality of individual electrodes (first electrodes) 5 formed of tungsten (W) mounted on the growth surface of the phosphorous-doped CVD diamond n-type crystal layer 3, and one common electrode (second electrode) 7 formed of tungsten (W) mounted on the back surface of the boron-doped high-pressure diamond p-type crystal layer (p-type semiconductor layer) 1.

Each individual electrode 5 is connected to an aluminum wire 51, and the common electrode 7 is connected to an aluminum wire 71.

A high quality diamond that does not include detectable lattice defects or impurities other than the dopant is used for the p-type semiconductor layer 1 and the n-type semiconductor layer 3.

In a IV group semiconductor such as diamond or silicon, it is common to add a II-III group element to provide a p-type electric conductivity, and to add a V-VI group element to provide an n-type electric conductivity. Examples of the p-type dopant for diamond include boron, and examples of the n-type dopant include phosphorous, sulfur and lithium.

The boron-doped synthetic diamond p-type crystal layer 1 that constitutes the pn junction diamond ultraviolet light-emitting device 10 for the free exciton recombination radiation is formed of a synthetic diamond crystal obtained by the high temperature and high pressure method explained below.

In this explanation, the high temperature and high pressure method refers to the so-called temperature difference method, and according to this diamond manufacturing method, carbon material is dissolved to flux metal and this carbon is deposited on a seed crystal (diamond microcrystal) in a temperature and pressure region under which diamond can exist stably.

The diamond manufacturing method utilizing the temperature difference method is disclosed for example in Japanese Patent Laid-Open Publication Nos. 4-108532 (108532/92) and 5-200271 (200271/93).

As for the flux metal, a material is used that is capable of sufficiently dissolving carbon and also works as a catalyst that accelerates the crystal growth of diamond. Actually, as disclosed in documents (for example, Kanda et al., Nippon Kagaku Kaishi (The Chemical Society of Japan), 1981, vol. 9, pp. 1349–1355), an alloy including iron (Fe) and/or cobalt (Co) and/or nickel (Ni) is used as the flux metal.

The boron-doped p-type synthetic diamond layer (p-type semiconductor layer) 1 is formed using the temperature difference method (the high temperature and high pressure method) and under the following conditions of growth.

[Conditions of Growth]
Carbon material: pyrolysis carbon; doped with 3000 ppm of boron Flux metal: iron (Fe)—cobalt (Co) alloy
Nitrogen remover: aluminum (Al), titanium (Ti), zirconium (Zr)
Growth temperature: 1450° C.
Synthesis pressure: 6.3 GPa
Growth time: 50 hours In the list, nitrogen remover refers to a metal having higher affinity with nitrogen than carbon, and capable of reducing the nitrogen concentration in the diamond crystal when added to the flux metal. As disclosed in documents (for example, H. Sumiya and S. Satho, Diam. Related Matter, Vol. 5, p. 1359 (1996)), the actual example includes Al, Ti and Zr.

Under the above-mentioned conditions, the seed crystal is placed so that the direction of growth is [001], and the crystal is synthesized. As a result, a blue-color single crystal having a facet of {100} and {111} weighing 64.0 mg is created.

The formed crystal is cleaved along the (111) surface, and is polished into a plate-like shape with a thickness of 0.5 mm and a size of 1 mm×2 mm using a skeif grinder.

The boron concentration in the crystal is measured using an infrared absorption spectroscopy (refer to R. M. Cherenko, M. Strong and R. E. Tuft, Phil. Mag., vol. 23, p. 313, 1971). The infrared (IR) absorption spectrum of the sample is measured using a micro IR apparatus, and the absorbance a1 at a wave number of 1280 [1/cm] or the absorbance a2 at a wave number of 2800 [1/cm] is computed. The former is effective if the boron concentration in the crystal is 10 ppm or more, and the latter is effective when the concentration is less than 10 ppm. The conversion formula of the former and latter values is represented by the following equation (1).

$$a2/a1 = 22 \quad (1)$$

When the film thickness is represented by d [cm], the effective acceptor concentration NA (of the boron included in the crystal, the concentration of boron atoms being active acceptors) within the crystal can be calculated by the following equation (2). When this method is applied, the effective acceptor concentration within the crystal is calculated as 9 ppm.

Further, since no absorption peak related to nitrogen (1130, 1185, 1282, 1370 [1/cm]) is observed according to the IR spectrum measurement, the nitrogen concentration within the crystal is calculated as 0.1 ppm or less.

$$NA[\text{ppm}] = 0.086 \times a1/d \quad (2)$$

A phosphorous-doped n-type diamond layer 3 being grown homoepitaxially by MW-CVD method is grown on this boron-doped p-type diamond layer 1.

The homoepitaxial growth of the n-type diamond layer 3 is performed by an MW-CVD apparatus and using a high-grade methane gas and a high-grade hydrogen gas and under the following conditions.

Upon growth, the sample surface is cleaned by performing $H_2$ plasma processing for 10 minutes.

[Conditions of Growth]
Substrate: boron-doped p-type synthetic diamond
MW output: 600 W
Gas: $CH_4$; 0.0125%, $H_2$; 99.9875%
Phosphorous source: trimethyl phosphorous ($P(CH_3)_3$)
P/C ratio: 2200 ppm
Gas purity: $CH_4$; 99.9999%, $H_2$; 99.99999%
Flow rate: 200 ml/min
Synthesis pressure: 40 Torr
Temperature: 900–950° C.
Growth time: 50 hours The thickness of the CVD diamond n-type crystal layer is 0.7 μm. Since a hydrogen termination conductive layer is generally formed on the surface of the diamond formed by the CVD method, the sample is treated in a chromic acid mixture for 10 minutes so as to insulate the diamond surface.

Then, first electrodes 5 made of tungsten is formed on the phosphorous-doped n-type CVD diamond film (n-type semiconductor layer) 3 through sputtering.

[Conditions for Sputtering]
Target: tungsten (W)
Gas flow rate: Ar; 30 ml/min
Pressure: 5 mTorr
Substrate temperature: 200° C.
Voltage: 700 V
Current: 1 A
Time: 4 min
Thickness: 300 Å

Next, a positive photoresist layer is formed on the tungsten layer (first electrode) 5 by spin coating and the like (photoresist viscosity: 15 Cp, revolution: 3,500 rpm, time: 30 sec), which is dried under atmosphere at 80° C. for 30 minutes, and then unnecessary portions are exposed to ultraviolet using a mask aligner (ultraviolet exposure: 350 mJ/cm$^2$), the exposed portions being removed using a photoresist developer, and it is dried in atmosphere at 130° C. for 30 minutes, thereby creating the resist film.

The resist film is used to perform etching of the tungsten layer using aqua regia (hydrochloric acid: nitric acid=3:1) for three minutes.

Thereafter, acetone is used to perform ultrasonic cleaning for three minutes, so as to remove the resist and to fabricate electrodes 5.

On the back surface of the boron-doped p-type synthetic diamond layer 1, a second electrode 7 is formed using tungsten in a similar manner, thereby completing the pn junction diamond ultraviolet light-emitting device 10 using CVD diamond.

Figure 3:
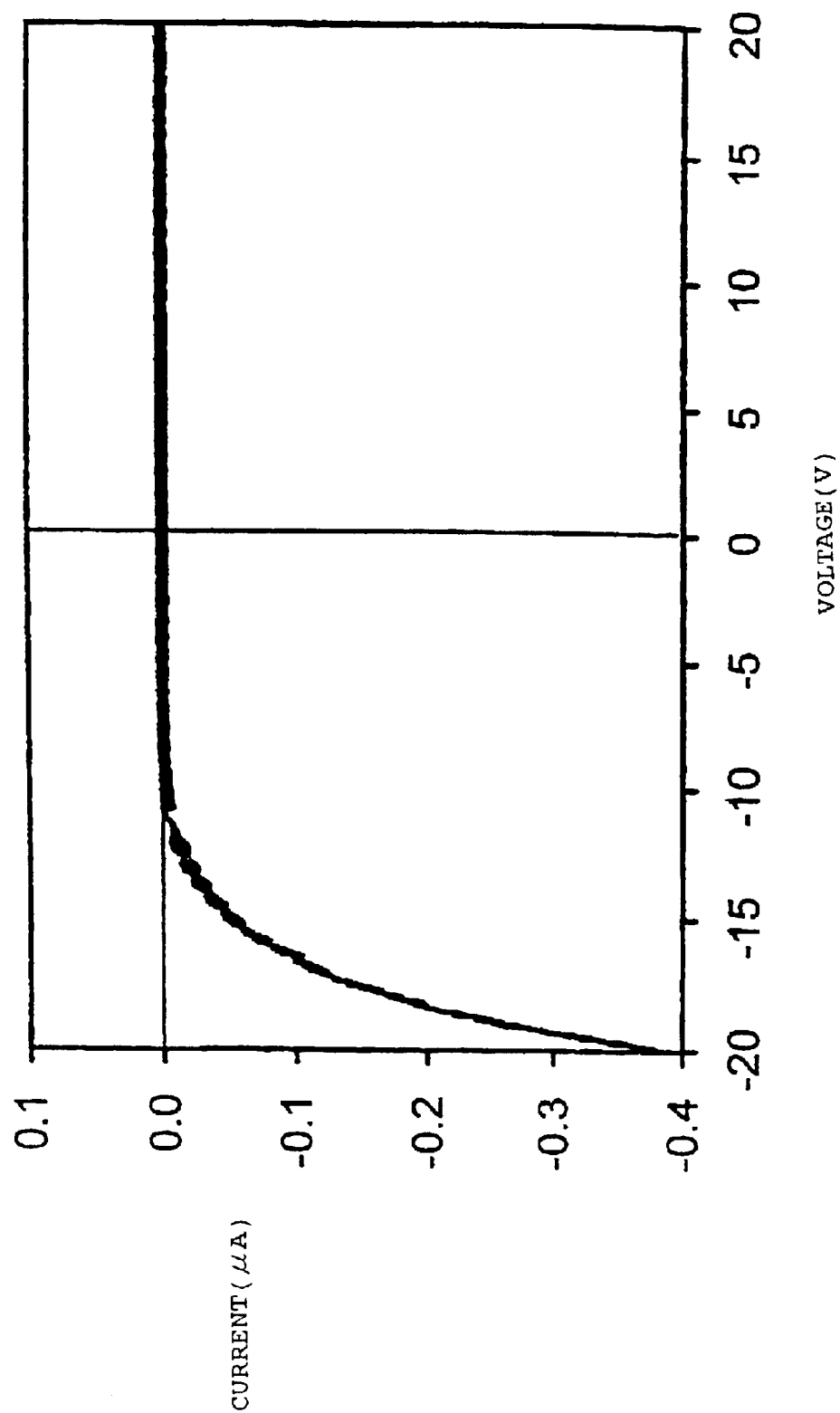
FIG. 3 is a diode characteristic chart of the diode-structure diamond ultraviolet light-emitting device according to the present invention.

FIG. 3 is referred to in explaining the current-voltage characteristic of the pn junction diamond ultraviolet light-emitting diode 10 utilizing the CVD diamond crystal formed as explained, that realizes the free exciton recombination radiation. In FIG. 3, the horizontal axis represents the voltage (V) applied between the first electrode 5 and the second electrode 7, and the vertical axis represents the current (μA) flowing from the first electrode 5 to the second electrode 7.

As is clearly shown in the drawing, when a reverse bias voltage is applied so that the potential of the first electrode 5 becomes positive, the leakage current is 0.01 μA or smaller until the voltage exceeds 20 V. When a forward bias voltage is applied where the first electrode 5 becomes negative, the current increases greatly from about −12 V. This result shows that a diode characteristic is obtained by the pn junction structure of the present device.

Figure 4:
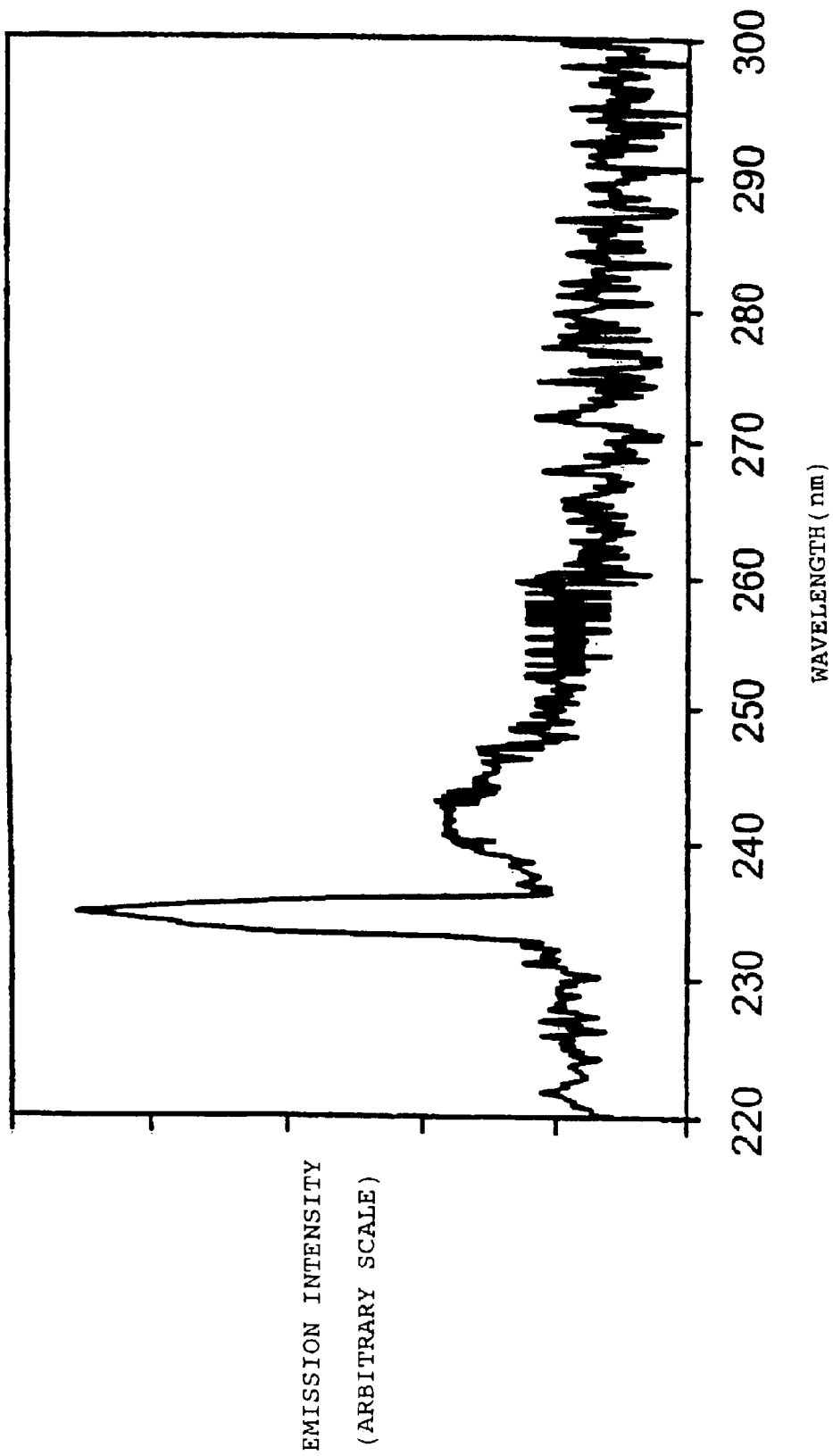
FIG. 4 is a characteristic chart showing the free exciton recombination radiation (ultraviolet radiation) caused by current injection according to the diode-structure diamond ultraviolet light-emitting device according to the present invention.

FIG. 4 is referred to in explaining the result of measurement of the current injection emission spectrum.

FIG. 4 shows the result of measurement of the light emitted when 80 V of voltage is applied between the electrodes and 1 mA of current flows therethrough, wherein the horizontal axis represents the wavelength (nm) and the vertical axis represents the emission intensity (arbitrary scale).

As clearly shown in FIG. 4, the emission advantageously shows a main peak at around 235 nm in the ultraviolet region, and a minor peak at around 242 nm. These two peaks are both obtained by the free exciton recombination radiation. On the other hand, in the wavelength range of under 300 nm, there are no other emission peaks such as a boron bound exciton recombination radiation (238 nm) observed.

Therefore, according to the present invention, the ultraviolet radiation caused by current injection shows a strong free exciton recombination radiation having a high efficiency, and includes very weak radiation caused by impurities/lattice defects having low efficiency, so it can be concluded that according to the invention a diode-structure diamond ultraviolet light-emitting device is obtained that realizes the free exciton recombination radiation having a high emission efficiency.

Now, according to a second embodiment of the present invention, the actual composition of a diode-structure diamond ultraviolet light-emitting device activated by current injection in which the free exciton recombination radiation is dominant is explained with reference to FIG. 1 and FIG. 2, the same drawings that were referred to in the first embodiment.

The pn junction diamond ultraviolet light-emitting device 10 that realizes the free exciton recombination radiation comprises a p-type semiconductor layer 1 formed of boron-doped p-type synthetic diamond formed by the high temperature and high pressure method, a sulfur-doped n-type CVD diamond layer (n-type semiconductor layer) 3 grown on the surface of the p-type semiconductor layer 1 by the CVD method, a plurality of individual electrodes (first electrodes) 5 made of titanium (Ti) mounted on the growing surface of the sulfur-doped n-type CVD diamond layer 3, and one common electrode (second electrode) 7 made of titanium (Ti) formed on the back surface of the boron-doped p-type synthetic diamond layer (p-type semiconductor layer) 1.

Each individual electrode 5 is connected to an aluminum wire 51, and the common electrode 7 is connected to an aluminum wire 71.

A high quality diamond that does not include detectable lattice defects or impurities other than the dopant is used for the p-type semiconductor layer 1 and the n-type semiconductor layer 3.

The boron-added high pressure diamond p-type crystal layer (p-type semiconductor layer) 1 is manufactured by a temperature difference method (high temperature and high pressure method) under the following conditions of growth.

[Conditions of Growth]
Carbon material: pyrolysis carbon; 1000 ppm of boron is added as dopant
Flux metal: iron (Fe)—cobalt (Co) alloy
Nitrogen remover: aluminum (Al), titanium (Ti), zirconium (Zr)
Growth temperature: 1450° C.
Synthetic pressure: 6.3 GPa
Growth time: 80 hours Under the above-mentioned conditions, the seed crystal is placed so that the direction of growth is [001], and the crystal is synthesized. As a result, a blue-color single crystal having a facet of {100} and {111} weighing 81.1 mg is created.

The formed crystal is polished into a plate-like shape having the (001) surface as the upper and lower surfaces with a thickness of 0.5 mm and a size of 1 mm×2 mm using a skeif grinder.

The boron concentration of the crystal is measured using IR absorption spectroscopy similar to the first embodiment, and as a result, the effective acceptor concentration within the crystal is calculated as 1.4 ppm.

Further, since no absorption peak related to nitrogen (1130, 1185, 1282, 1370 [1/cm]) was observed according to the IR spectrum measurement, the nitrogen concentration within the crystal measured by the IR absorption spectroscopy is calculated as 0.1 ppm or less.

$$NA[\text{ppm}] = 0.086 \times a1/d \quad (2)$$

A sulfur-doped n-type diamond layer 3 is grown homoepitaxially by the MW-CVD method on the boron-doped p-type diamond layer 1.

The homoepitaxial growth of the n-type diamond layer 3 is performed using an MW-CVD apparatus and with a high-grade methane gas and a high-grade hydrogen gas and under the following conditions.

Upon growth, the sample surface is cleaned by performing $H_2$ plasma processing for 10 minutes.

[Conditions of Growth]
Substrate: boron-doped synthetic diamond crystal
MW output: 500 W
Gas: $CH_4$; 1%, $H_2$; 99%
Sulfur source: hydrogen sulfide ($H_2S$)
S/C ratio: 5000 ppm
Gas purity: $CH_4$; 99.9999%, $H_2$; 99.99999%
Flow rate: 100 ml/min
Synthesis pressure: 40 Torr
Temperature: 900° C.
Growth time: 100 min The thickness of the sulfur-doped n-type CVD diamond layer is 1 μm. The sample is processed by chromic acid mixture for 10 minutes so as to insulate the surface.

Then, first electrodes 5 made of titanium is formed on the sulfur-doped n-type CVD diamond film (n-type semiconductor layer) 3 through sputtering.

[Conditions for Sputtering]
Target: titanium (Ti)
Gas flow rate: Ar; 30 ml/min
Pressure: 5 mTorr
Substrate temperature: 200° C.
Voltage: 700 V
Current: 1 A
Time: 4 min
Thickness: 500 Å

Next, a resist film is formed on the titanium layer (first electrode) 5 in a manner similar to the first embodiment.

The resist film is used to perform etching of the titanium layer using fluoroboric acid for five seconds.

Thereafter, acetone is used to perform ultrasonic cleaning for three minutes, so as to remove the resist and to fabricate electrodes 5.

On the back surface of the boron-doped p-type synthetic diamond layer 1, a second electrode 7 is formed using titanium in a similar manner, so as to complete the pn junction diamond ultraviolet light-emitting device 10 using CVD diamond crystal.

Figure 5:
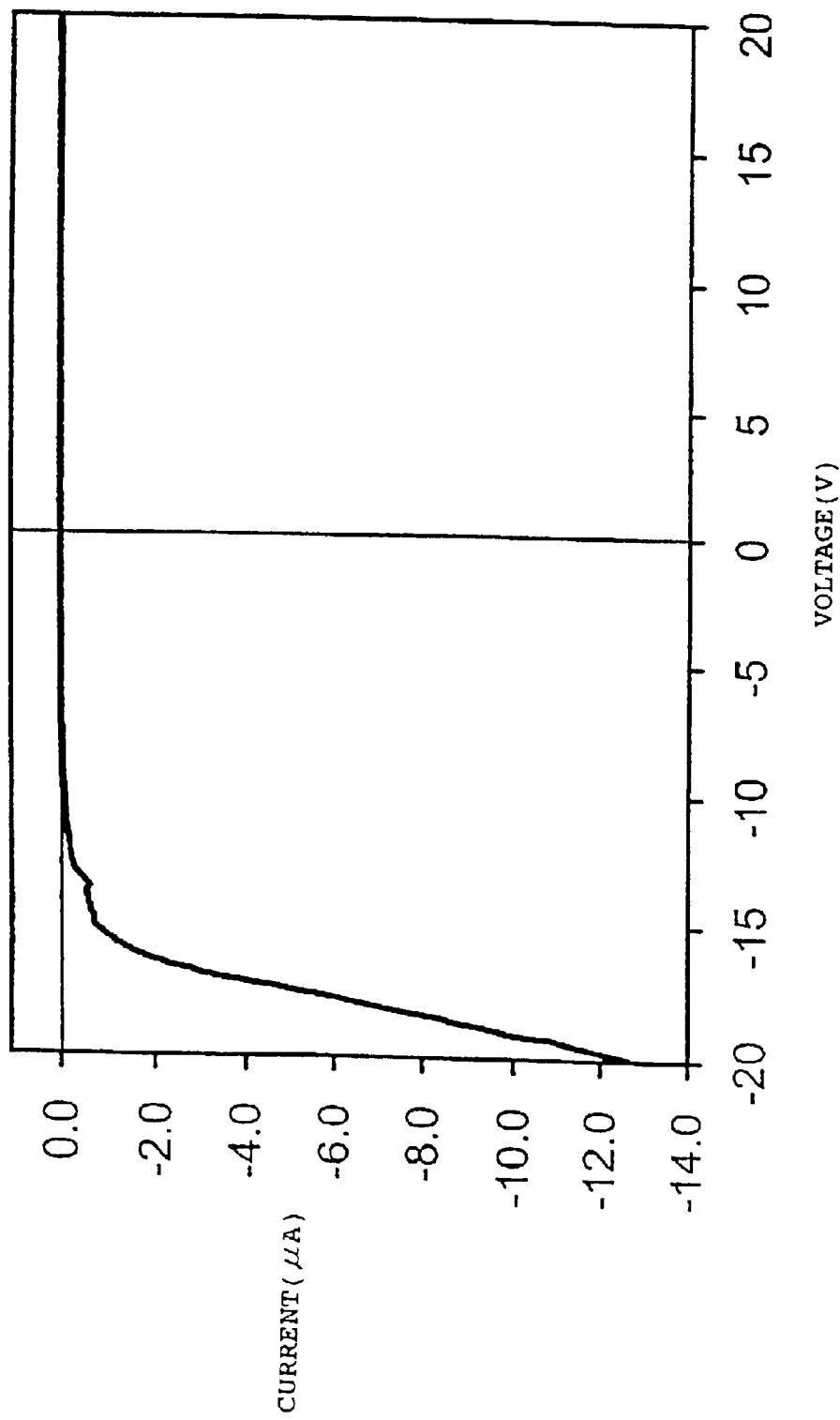
FIG. 5 is a diode characteristic chart of the diode-structure diamond ultraviolet light-emitting device according to the second embodiment of the present invention.

FIG. 5 is referred to in explaining the current-voltage characteristic of the pn junction diamond ultraviolet light-emitting diode 10 utilizing the CVD diamond formed as explained above that realizes the free exciton recombination radiation. In FIG. 5, the horizontal axis shows the voltage (V) applied between the first electrode 5 and the second electrode 7, and the vertical axis shows the current (μA) flowing from the first electrode 5 to the second electrode 7.

As is clearly shown in the drawing, when a reverse bias voltage is applied so that the potential of the first electrode 5 becomes positive, the leakage current is 0.01 μA or smaller until the voltage exceeds 20 V. When a forward bias voltage is applied by which the first electrode 5 becomes negative, the current increases greatly from about −10 V. This result shows that a diode characteristic is obtained by the pn junction structure of the present device.

Figure 6:
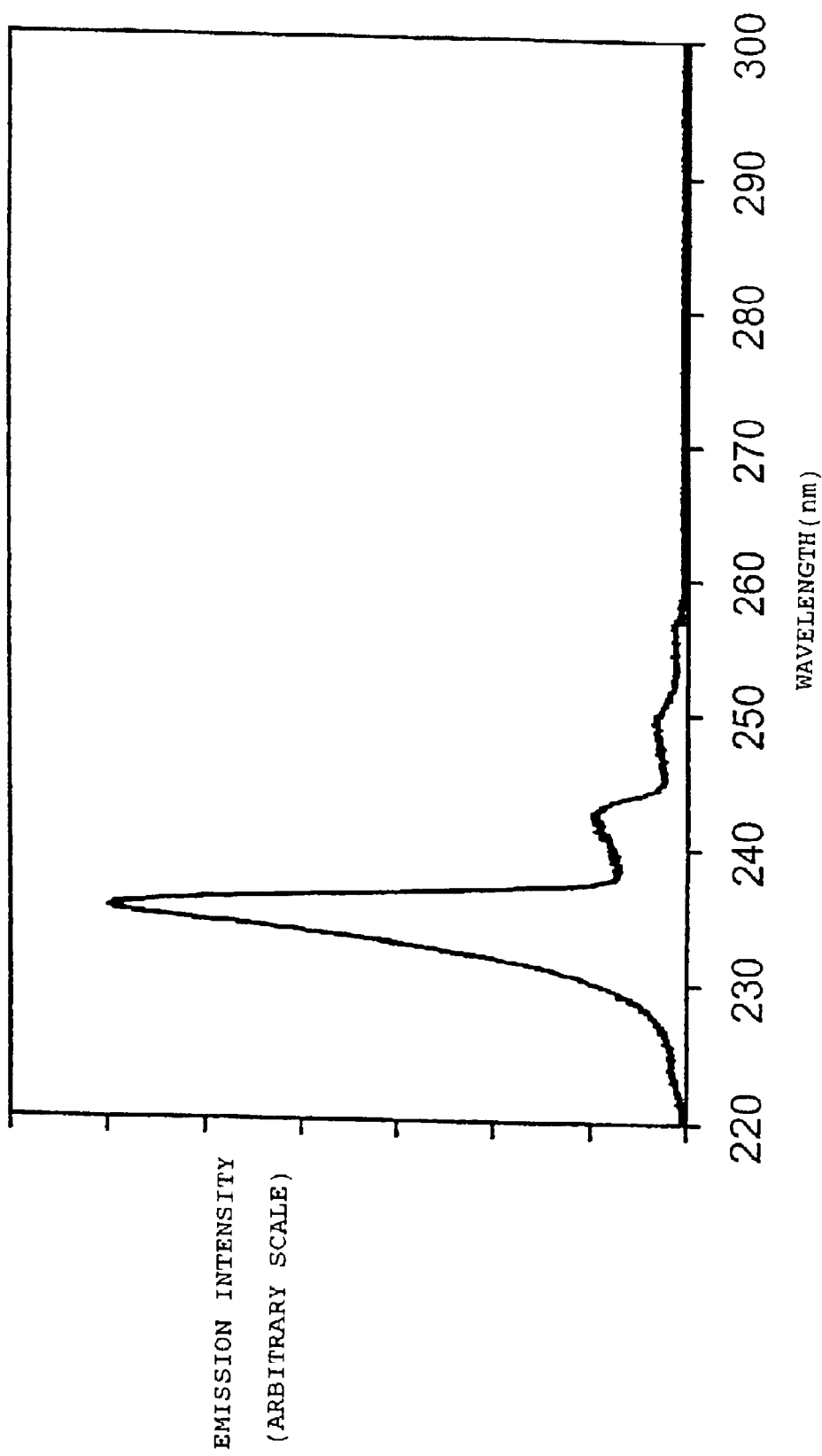
FIG. 6 is a characteristic chart showing the free exciton recombination radiation (ultraviolet radiation) caused by current injection according to the diode-structure diamond ultraviolet light-emitting device according to the second embodiment of the present invention.

FIG. 6 is referred to in explaining the result of measurement of the current injection emission spectrum.

FIG. 6 shows the result of measurement of the light emitted when 70 V of voltage is applied between the electrodes and 50 μA of current flows therethrough, wherein the horizontal axis represents the wavelength (nm) and the vertical axis represents the emission intensity (arbitrary scale).

As clearly shown in FIG. 6, the emission advantageously shows a main peak at around 235 nm in the ultraviolet region, and a minor peak at around 242 nm. These two peaks are both results of the free exciton recombination radiation. On the other hand, in the wavelength range of under 300 nm, there are no other emission peaks such as a boron bound exciton recombination radiation (238 nm) observed.

Therefore, according to the second embodiment, the ultraviolet radiation caused by current injection shows a strong free exciton recombination radiation having high efficiency, and shows only weak radiation caused by impurities/lattice defects having low efficiency, so it can be concluded that a diode structure diamond ultraviolet light-emitting device is obtained that realizes the free exciton recombination radiation having high emission efficiency.

The influence that the boron concentration within the p-type diamond crystal 1 has against ultraviolet emission property according to the diode structure diamond ultraviolet light-emitting device 10 of the present invention is studied, the result of which explained with reference to Table 1.

The device formed according to the first embodiment of the invention is used as example 1, and the pn junction diamond light-emitting device according to example 2 and that of the comparison example 1 is manufactured under the same conditions as example 1, except for the amount of boron being added when fabricating the p-type boron-doped high pressure crystal. Further, the device fabricated according to the second embodiment is used as example 3. The amount of boron being added to the p-type crystal of each example is as listed below, showing the amount of boron being added to the material carbon (ppm).

Example 1 (Phosphorous-doped n-type Crystal)
 Amount of added boron; 3000 ppm
Example 2 (Phosphorous-doped n-type Crystal)
 Amount of added boron; 30000 ppm
Example 3 (Sulfur-doped n-type Crystal)
 Amount of added boron; 1000 ppm
Comparison Example (Phosphorous-doped n-type Crystal)
 Amount of added boron; 100000 ppm

TABLE 1

| Device | Boron concentration measured by SIMS method (ppm) | Free exciton recombination radiation by current injection |
| --- | --- | --- |
| Example 1 | 6.0 | yes |
| Example 2 | 88 | yes |
| Example 3 | 0.44 | yes |
| Comparison example 1 | 150 | no |

According to the device of example 2 the free exciton recombination radiation is observed, but according to the device of comparison example 1 no free exciton recombination radiation is observed.

As a result of measuring the boron concentration of the p-type diamond layer of the devices according to example 1, example 2, example 3 and comparison example 1 respectively by secondary ion mass spectroscopy (SIMS), a value of 6.0, 88, 0.44 and 150 ppm is obtained. Therefore, it is understood that in order to obtain the free exciton recombination radiation, the maximum boron concentration is approximately 100 ppm.

As explained, the present invention enables to provide a diode-structure diamond ultraviolet light-emitting device utilizing a CVD diamond crystal in which the free exciton recombination radiation based on current injection is dominant.

Figure 7:
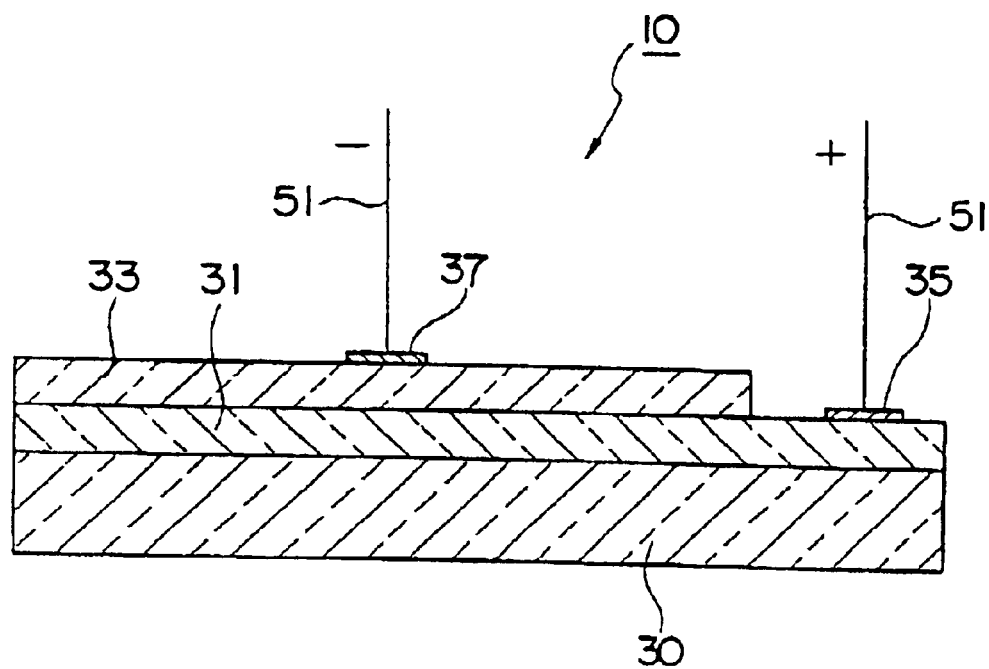
FIG. 7 is a conceptual diagram showing the structure of the diode-structure diamond ultraviolet light-emitting device according to the third embodiment of the present invention. Reference 30 shows a diamond substrate formed by the high temperature and high pressure method, 31 shows a boron-doped CVD diamond p-type crystal layer (p-type semiconductor layer), 33 shows a sulfur-doped CVD diamond n-type crystal layer (n-type semiconductor layer), 35 and 37 show electrodes (Au/Ti), and 51 shows an aluminum wire (lead wire).

Now, FIG. 7 is referred to in explaining the actual structure of a third embodiment of the present invention, which is a diode-structure diamond ultraviolet light-emitting device activated by current injection in which the free exciton recombination radiation is dominant.

The pn junction diamond ultraviolet light-emitting device 10 realizing the free exciton recombination radiation according to the third embodiment comprises an insulative substrate 30 formed of diamond monocrystal synthesized by the high temperature and high pressure synthesis method, a boron-doped p-type CVD diamond layer (p-type semiconductor layer) 31 grown on the surface of the insulative substrate 30 by the CVD method, a sulfur-doped n-type CVD diamond layer (n-type semiconductor layer) 33 grown selectively on a portion of the CVD surface of the boron-doped p-type CVD diamond layer (p-type semiconductor layer) 31 by the CVD method, a first electrode 35 made of titanium (Ti) and gold (Au) mounted on a portion of the surface of the boron-doped p-type CVD diamond layer 31, and a second electrode 37 made of titanium (Ti) and gold (Au) formed on the CVD growth surface of the sulfur-doped n-type CVD diamond layer 33.

The first electrode 35 and the second electrode 37 are each connected to an aluminum wire 51.

A high quality diamond that does not include detectable lattice defects or impurities other than the dopant is used for the p-type semiconductor layer 31 and the n-type semiconductor layer 33.

As for the insulative substrate 30, a diamond monocrystal formed by high pressure synthesis method is used.

The boron-doped p-type CVD diamond layer (p-type semiconductor layer) 31 is manufactured using an MW-CVD apparatus and under the following conditions of growth.

[Conditions of Growth]
Substrate: insulative synthetic diamond crystal, polished at (100) surface
MW output: 750 W
Gas flow rate: 400 ml/min
$CH_4$ concentration: 0.025% ($H_2$ dilution)
Gas purity: $CH_4$; 99.9999%, $H_2$; 99.99999%
B source: $B(CH_3)_3$
B/C: 300 ppm
Growth temperature: 870° C.
Synthetic pressure: 25 Torr
Growth time: 118 hours
Film thickness: 1.5 μm Under the above-listed conditions, a synthetic diamond monocrystal 30 having a polished (100) surface is placed so that the direction of growth is [0011], and a boron-doped p-type CVD diamond layer 31 is thereby grown.

Next, a diamond substrate is positioned so as to cover a portion of the boron-doped p-type diamond monocrystal 31, and a sulfur-doped n-type diamond layer 33 is grown homoepitaxially by the MW-CVD method selectively only to the remaining exposed portion.

The homoepitaxial growth of the n-type CVD diamond layer 33 is performed using a MW-CVD apparatus and with a highly pure methane gas and a highly pure hydrogen gas and under the following conditions.

Upon growth, the sample surface is cleaned by performing $H_2$ plasma processing thereto for 10 minutes.

[Conditions of Growth]
Substrate: boron-doped CVD diamond crystal
MW output: 500 W
Gas: $CH_4$; 1.0%, $H_2$; 99%
Sulfur source: hydrogen sulfide ($H_2S$)
S/C ratio: 5000 ppm
Gas purity: $CH_4$; 99.9999%, $H_2$; 99.99999%
Flow rate: 100 ml/min
Synthesis pressure: 40 Torr
Temperature: 900° C.
Growth time: 100 min
Film thickness: 1.0 $\mu$m The thickness of the sulfur-doped n-type CVD diamond layer 33 is 1 $\mu$m. The sample is processed by chromic acid mixture for 10 minutes so as to insulate the surface.

Then, the diamond mask formed on the boron-doped p-type CVD diamond layer (p-type semiconductor layer) 31 is removed, and electrodes 35 and 37 made of Au/Ti are respectively formed by sputtering on the exposed surface of the boron-doped p-type CVD diamond layer (p-type semiconductor layer) 31 and on the appropriate position on the surface of the sulfur-doped n-type CVD diamond layer 33. The electrodes 35 and 37 are fabricated first by forming a layer of titanium (Ti) on the diamond crystal layer 31 and 33, and then forming a layer of gold (Au) on the top.

[Conditions for Sputtering 1]
Target: titanium (Ti)
Gas flow rate: Ar; 30 ml/min
Pressure: 5 mTorr
Substrate temperature: 200° C.
Voltage: 700 V
Current: 1 A
Time: 4 min
Thickness: 500 Å

[Conditions for Sputtering 2]
Target: gold (Au)
Gas flow rate: Ar; 30 ml/min
Pressure: 5 mTorr
Substrate temperature: 200° C.
Voltage: 700 V
Current: 1.5 A
Time: 10 min
Thickness: 500 Å

Next, a resist film is formed on the gold layer in a manner similar to the first embodiment.

The resist film is used to perform etching of the gold layer and the titanium layer using fluoroboric acid for five seconds.

Thereafter, acetone is used to perform ultrasonic cleaning for three minutes, so as to remove the resist and to fabricate electrode 5.

According to the above steps, the pn junction diamond ultraviolet light-emitting device 10 utilizing a synthetic diamond crystal is manufactured.

Figure 8:
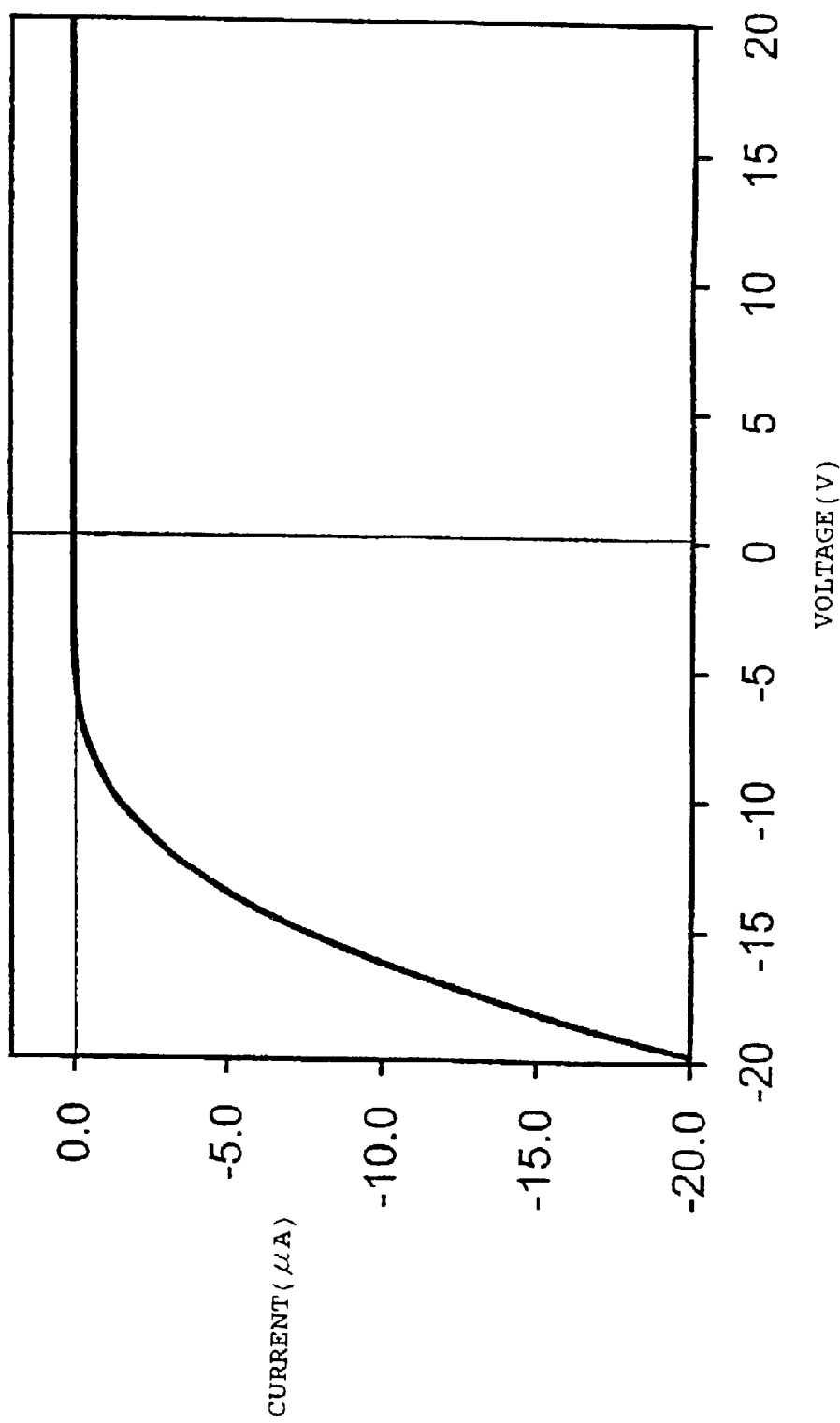
FIG. 8 is a diode characteristic chart of the diode-structure diamond ultraviolet light-emitting device according to the ninth embodiment of the present invention.

FIG. 8 is referred to in explaining the current-voltage characteristic of the pn junction diamond ultraviolet light-emitting device 10 utilizing the CVD diamond crystal formed as explained above that realizes the free exciton recombination radiation. In FIG. 8, the horizontal axis represents the voltage (V) applied between the first electrode 35 and the second electrode 37, and the vertical axis represents the current ($\mu$A) flowing from the first electrode 35 to the second electrode 37.

As is clearly shown in the drawing, when a reverse bias voltage is applied so that the potential of the first electrode 35 becomes positive, the leakage current is 10 pA or smaller until the voltage exceeds 20 V. When a forward bias voltage is applied by which the first electrode 35 becomes negative, the current increases greatly from about −15 V. This result shows that a diode characteristic is obtained by the pn junction structure of the present device.

Figure 9:
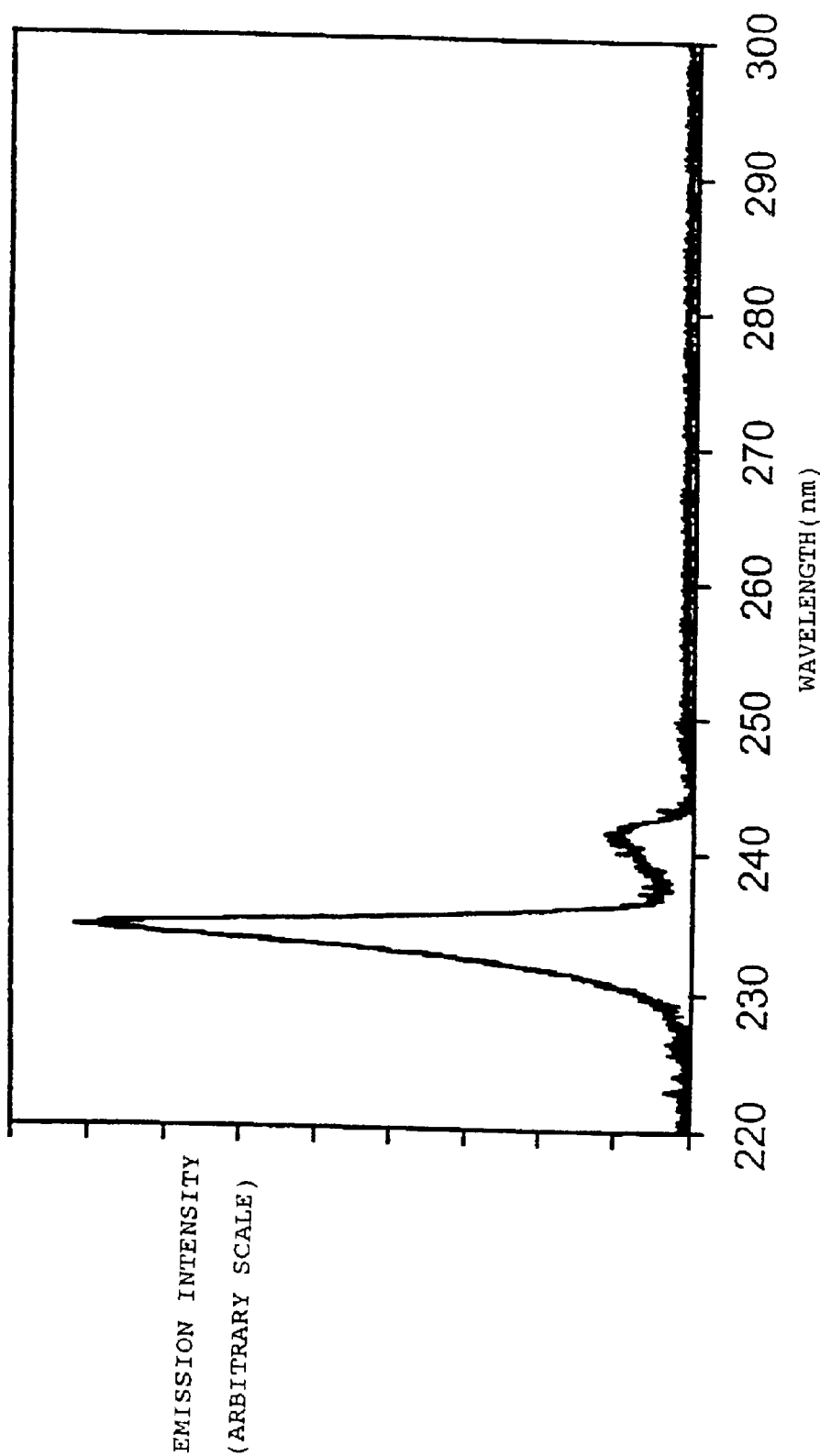
FIG. 9 is a characteristic chart showing the free exciton recombination radiation (ultraviolet radiation) caused by current injection of the diode-structure diamond ultraviolet light-emitting device according to the third embodiment of the present invention.

FIG. 9 is referred to in explaining the result of measurement of the current injection emission spectrum.

FIG. 9 shows the result of measurement of the light emitted when 50 V of forward voltage is applied between the two electrodes and 1 mA of current flows therethrough, wherein the horizontal axis represents the wavelength (nm) and the vertical axis represents the emission intensity (arbitrary scale).

As clearly shown in FIG. 9, the emission advantageously shows a main peak at around 235 nm in the ultraviolet region resulting from the free exciton recombination radiation, and a minor peak at around 242 nm. These two peaks are both obtained by the free exciton recombination radiation. On the other hand, in the wavelength range of under 300nm, there are no other emission peaks such as a boron-related bound exciton recombination radiation (238 nm) observed.

Therefore, according to the third embodiment, the ultraviolet radiation caused by current injection shows a strong free exciton recombination radiation having a high efficiency, and includes very weak radiation caused by impurities/lattice defects having low efficiency, so it can be concluded that a diode structure diamond ultraviolet light-emitting device is obtained that realizes the free exciton recombination radiation having a high emission efficiency.

According to the third embodiment, the first CVD semiconductor diamond layer formed above the synthetic diamond crystal is a p-type semiconductor layer, and an n-type semiconductor formed of a second CVD diamond layer is grown thereon, but according to another example of the invention, the first CVD semiconductor diamond layer formed on the synthetic diamond crystal can be an n-type semiconductor layer, and the second CVD semiconductor diamond layer formed thereon can be a p-type semiconductor layer.

INDUSTRIAL APPLICABILITY

As explained, the diode-structure diamond ultraviolet light-emitting device realizing the free exciton recombination radiation according to the present invention is capable of generating a short-wavelength ultraviolet radiation resulting from current injection.

We claim:

1. A diode-structure diamond ultraviolet light-emitting device, said device comprising a p-type semiconductor layer formed of diamond crystal, and an n-type semiconductor layer formed of diamond crystal, said device emitting light when excited by current injection, wherein the free exciton recombination radiation is dominant, and wherein said the free exciton recombination radiation being dominant refers to a state where the intensity of the free exciton recombination radiation is at least two times or more greater than the intensity of radiation caused by impurities or defects, wherein said diode-structure diamond ultraviolet light-emitting device comprises a pn junction.

2. A diode-structure diamond ultraviolet light-emitting device according to claim 1, wherein both said diamond crystals are high-quality crystals including only a minute amount of impurity other than the dopant.

3. A diode-structure diamond ultraviolet light-emitting device according to claim 1, wherein said n-type diamond crystal is a diamond crystal doped with phosphorous.

4. A diode-structure diamond ultraviolet light-emitting device according to claim 1, wherein said n-type diamond crystal is a diamond crystal doped with sulfur.

5. A diode-structure diamond ultraviolet light-emitting device according to claim 1, wherein said n-type diamond crystal is a diamond crystal grown by the chemical vapor deposition method.

6. A diode-structure diamond ultraviolet light-emitting device according to claim 5, wherein said diamond crystal grown by the chemical vapor deposition method is a homoepitaxial film grown homoepitaxially on a diamond crystal substrate.

7. A diode-structure diamond ultraviolet light-emitting device according to claim 5, wherein said diamond crystal grown by chemical deposition method is a diamond crystal film grown by the microwave plasma-assisted vapor deposition method.

8. A diode-structure diamond ultraviolet light-emitting device according to claim 1, wherein said p-type semiconductor diamond crystal is a diamond crystal doped with boron.

9. A diode-structure diamond ultraviolet light-emitting device according to claim 8, wherein said boron-doped diamond crystal has a boron concentration of 100 ppm or smaller.

10. A diode-structure diamond ultraviolet light-emitting device according to claim 1, wherein said p-type semiconductor diamond crystal is a crystal synthesized by the high temperature and high pressure synthesis method.

11. A diode-structure diamond ultraviolet light-emitting device according to claim 10, wherein said high-temperature and high-pressure synthetic diamond crystal is synthesized by adding a nitrogen remover to the flux.

12. A diode-structure diamond ultraviolet light-emitting device according to claim 1, wherein said p-type semiconductor diamond crystal is a diamond crystal grown by the chemical vapor deposition method.

13. A diode-structure diamond ultraviolet light-emitting device according to claim 1, wherein a first diamond crystal grown by the chemical vapor deposition method is formed on a diamond substrate, and a second diamond crystal grown by the chemical vapor deposition method is further formed thereon.

14. A diode-structure diamond ultraviolet light-emitting device according to claim 13, wherein said first diamond crystal grown by the chemical vapor deposition method is either a p-type semiconductor diamond crystal or an n-type semiconductor diamond crystal, and said second diamond crystal grown by the chemical vapor deposition method is either an n-type semiconductor diamond crystal or a p-type semiconductor diamond crystal that differs from the first diamond crystal grown by the chemical vapor deposition method.

15. A diode-structure diamond ultraviolet light-emitting device according to claim 13, wherein said second diamond layer grown by the chemical vapor deposition method is grown selectively on said first diamond layer grown by the chemical vapor deposition method.

16. A diode-structure diamond ultraviolet light-emitting device according to claim 13, wherein an electrode is formed on the exposed surface of said first diamond layer grown by the chemical vapor deposition method.

17. A diode-structure diamond ultraviolet light-emitting device, said device comprising a p-type layer formed of diamond crystal, and an n-type semiconductor layer formed of diamond crystal, said device emitting light when excited by current injection, wherein the free exciton recombination radiation is dominant, wherein said the free exciton recombination radiation being dominant refers to a state where the intensity of the free exciton recombination radiation is at least two times or more greater than the intensity of radiation caused by impurities or defects, wherein said p-type semiconductor layer is synthesized by means of a high temperature and high pressure synthesis method, and wherein said n-type diamond crystal is grown on said p-type semiconductor layer by means of a chemical vapor deposition method.

* * * * *